United States Patent
Zhang et al.

(10) Patent No.: US 8,298,468 B2
(45) Date of Patent: Oct. 30, 2012

(54) ISOSTATIC PRESSING METHOD FOR APPLYING A SILICON POWDER ONTO A SILICON BRICK FOR SILICON CRYSTAL GROWTH IN A MONO-CRYSTAL OR MULTI-CRYSTAL FURNACE

(75) Inventors: Tao Zhang, Jiangxi (CN); Yuepeng Wan, Jiangxi (CN); Dejing Zhong, Jiangxi (CN)

(73) Assignee: Jiangxi Sai Wei LDK Solar Hi-Tech Co., Ltd., Xinyu (CN)

( * ) Notice: Subject to any disclaimer, the term of this patent is extended or adjusted under 35 U.S.C. 154(b) by 142 days.

(21) Appl. No.: 12/811,270

(22) PCT Filed: Jun. 22, 2009

(86) PCT No.: PCT/CN2009/072374
§ 371 (c)(1),
(2), (4) Date: Aug. 4, 2010

(87) PCT Pub. No.: WO2009/155846
PCT Pub. Date: Dec. 30, 2009

(65) Prior Publication Data
US 2011/0027159 A1 Feb. 3, 2011

(30) Foreign Application Priority Data

Jun. 24, 2008 (CN) .......................... 2008 1 0106940
Jun. 24, 2008 (CN) .......................... 2008 1 0127205

(51) Int. Cl.
*C04B 35/653* (2006.01)
*C01B 33/02* (2006.01)
(52) U.S. Cl. ........................ 264/349; 423/348
(58) Field of Classification Search ........... 423/348–350
See application file for complete search history.

(56) References Cited

U.S. PATENT DOCUMENTS

| 6,110,853 A * | 8/2000 | Berger et al. ................ 501/97.4 |
| 6,447,600 B1 * | 9/2002 | Furukawa et al. ................ 117/2 |
| 7,175,685 B1 | 2/2007 | Hariharan et al. |
| 2007/0014682 A1 | 1/2007 | Hariharan et al. |

FOREIGN PATENT DOCUMENTS

| CN | 1956921 A | 5/2007 |
| CN | 101295749 A | 10/2008 |
| JP | 11314911 A | 11/1999 |
| JP | 2003286023 A | 10/2003 |
| JP | 2004284929 A | 10/2004 |
| WO | WO-0037719 A1 | 6/2000 |
| WO | WO-2007005729 A2 | 1/2007 |

OTHER PUBLICATIONS

Santana et al., "The effects of processing conditions on the density and microstructure of hot-pressed silicon powder" Journal of Materials Science 31 (1996) 4985-4990.*

Liu et al., "Effects of the amount of water and binder on cold isostatic pressing moldability and performance of green body", Ceramic Journal, vol. 27, No. 2, pp. 181-186, Jun. 2006.

* cited by examiner

*Primary Examiner* — Colleen Dunn
*Assistant Examiner* — Anthony J Zimmer
(74) *Attorney, Agent, or Firm* — Rabin & Berdo, P.C.

(57) ABSTRACT

An isostatic pressing method for applying silicon powder as an original raw material for silicon crystal growth includes pressing silicon powder having a particle size of 0.1 to 1,000 micrometers into a silicon brick employing cold or hot isostatic pressing to provide a pressed silicon brick; and charging the pressed silicon brick into a furnace for silicon crystal growth. The furnace for silicon crystal growth may be a mono-crystal furnace for growing monocrystalline silicon or a multi-crystal furnace for growing polycrystalline silicon.

8 Claims, No Drawings

ISOSTATIC PRESSING METHOD FOR APPLYING A SILICON POWDER ONTO A SILICON BRICK FOR SILICON CRYSTAL GROWTH IN A MONO-CRYSTAL OR MULTI-CRYSTAL FURNACE

FIELD OF THE INVENTION

The present invention belongs to the field of solar cell or semiconductor production, and relates to silicon wafer raw material. The first step in the method is pressing silicon powder into raw material silicon brick with good filling property by cold isostatic pressing or hot isostatic pressing, next, the resulting material is charged into a mono-crystal furnace or multi-crystal furnace as the original raw material for silicon crystal growth. The silicon brick can be used as raw material by melting in mono-crystal furnace or multi-crystal furnace to yield silicon rods or silicon ingots. Thus the silicon brick can be used as the original raw material for the production of silicon wafers for solar cells.

BACKGROUND OF THE INVENTION

The mono-crystal furnace mentioned in the invention is a furnace for growing monocrystalline silicon.

The multi-crystal furnace mentioned in the invention is a furnace for growing polycrystalline silicon.

The raw material silicon brick mentioned in the invention is the bulk unmelted silicon placed into a mono-crystal furnace or multi-crystal furnace, and is the raw material for the production of monocrystalline silicon or polycrystalline silicon.

A description of the related prior art follows:

First, it strongly emphasizes that there is no existing literature, including U.S. Pat. No. 7,175,685, reporting that isostatic pressing technology could reduce the negative influence of oxide film on the quality of silicon crystal growth in a mono-crystal furnace or multi-crystal furnace. There is also no existing literature reporting that raw material silicon brick with good filling property produced from silicon powder by cold isostatic pressing or hot isostatic pressing is good for reducing oxide film on the surface and therefore good for reducing the negative influence on the quality of silicon crystal growth in mono-crystal furnace or multi-crystal furnace.

Oxides on the surface of raw material silicon brick will cause a series of problems for subsequent processes. For instance, silicon feedstock melts with difficulty; volatile matter reacts with equipment components; and the quality of crystal and final products, like chips, solar cells, etc. is reduced. So the existing technology needs to use chemical solution to clean off the oxides on the surface of raw material silicon brick.

The use of high-purity silicon brick as raw material in the existing technology usually involves the processes of high temperature melting and cooling, or the process of vapor deposition. So its relative density is 100%, and its real density is 2.33 g/cm³. Even though high-purity silicon brick is high-priced, its source is widely available and easy acquired. Silicon brick having a high density and good mechanical properties can absolutely tolerate the process of cleaning off oxides on its surface by chemical solution. After testing several raw material silicon bricks having a relative density of 100% and a real density of 2.33 g/cm³ from different sources, the compression resistance parameter is always within a range of about 60 Mpa to 206 Mpa with an average of 150 MPa. The related detailed description is explained in Table I.

However, raw material silicon brick produced from silicon powder by isostatic pressing is without the processes of high temperature melting and cooling, and its relative density is unable to reach 100%, so its impact resistance to tolerate chemical solution cleaning its surface is weaker than the traditional raw material silicon brick with real density of 2.33 g/cm³.

Silicon powder, such as the powder related to U.S. Pat. No. 7,175,685, easily contacts the air and generates oxide film, because the specific surface area of silicon powder is very large. If silicon powder, which can easily flow with gases and damage devices seriously, is charged into a mono-crystal furnace or multi-crystal furnace for growth, the quality of the produced monocrystalline silicon or polycrystalline silicon is poor making it very hard to meet market required quality.

Second, the technologies of charging silicon raw material into a silicon crystal growth furnace, have long been quite perfect. The silicon raw material is charged into a mono-crystal furnace to finish monocrystalline silicon growth or into a multi-crystal furnace to finish polycrystalline silicon growth. Monocrystalline silicon or polycrystalline silicon growth normally includes the processes of melting by heating, slow crystal growth and cooling.

The produced monocrystalline silicon or polycrystalline silicon can be used for solar cells after a cutting process. There is a quality standard abided by the international solar cell industry, so the monocrystalline silicon or polycrystalline silicon before cutting process also abides by the common quality standard. Technologies of monocrystalline silicon or polycrystalline silicon growth are largely identical but have some minor differences. Consequently, whether a large amount of cheap silicon raw material can be used with a guaranteed quality is a question of great concern to manufacturers of monocrystalline silicon or polycrystalline silicon.

Third, the prior art first introduces the application situation of silicon powder or silicon brick as raw material in mono-crystal furnace or multi-crystal furnace.

Application situation of silicon powder: on the one hand, silicon powder can easily flow with gases, which impacts the normal working of devices and the health of production staff. So its application has been severely limited. On the other hand, compared to silicon brick, the specific surface area of silicon powder is large, so it easily to contacts the air and oxidizes during the process of packing, transportation and storage. Furthermore, the oxidized silicon powder has a negative effect on the final product, namely, solar cells. This negative influence can be tolerated in the case of a small amount usage of silicon powder. Therefore, we can use a small amount of silicon powder in a mono-crystal furnace or multi-crystal furnace to reduce the costs. However, it is almost impossible to reduce the production cost greatly by using a large amount of silicon powder in mono-crystal furnace or multi-crystal furnace. The detailed description is explained in subsequent paragraphs.

Application situation of silicon brick: bulk silicon brick as the raw material is the usual form that is charged into a mono-crystal furnace or multi-crystal furnace.

Silicon brick utilized as raw material in a mono-crystal furnace or multi-crystal furnace of the solar or semiconductor field should meet two basic requirements. First, its purity should be within a range of 99.99% to 99.9999999%, preferably of 99.999% to 99.9999999%, and the best is within a range of 99.9999% to 99.9999999%. Second the silicon brick must have certain degree of compression resistance. In this case, silicon brick dust produced by moving the silicon brick should be minimized as it can easily damage devices or the health of operation staff.

If the purity of the silicon is too high, then it is uneconomical to be utilized in the solar field. For instance, the cost of silicon having a purity of 99.9999999999% utilized in the semiconductor field is extremely high.

If the purity is too low, the quality of silicon ingot produced from a mono-crystal furnace or multi-crystal furnace is too poor to meet the industry standard. A purity grade of silicon within a range of 99.99% to 99.999% is low. However, if mixed with other high-purity silicon feedstock, it can meet the quality requirement of silicon ingots. As the main raw material of the solar field, silicon feedstock having a purity within a range of 99.999% to 99.9999999% or 99.9999% to 99.9999999% is optimum.

It strongly emphasizes that silicon brick having a certain level of compression resistance and purity of 99.999% to 99.9999999% or 99.9999% to 99.9999999% is mainly produced by vapor deposition method. Silicon brick is especially produced from silicon compounds (like trichlorosilane, silane, etc) by chemical vapor deposition at high temperature. Its density is about 2.33 g/cm$^3$. The detailed information is present in Table II.

Because high-purity waste silicon brick recycled from the semiconductor or solar industry has the process of casting, its density is also about 2.33 g/cm$^3$ with superior compression resistance, and its purity is within a range of 99.9999% to 99.9999999%.

Fourth, there is currently no appropriate method in the existing technology to apply silicon powder to mono-crystal furnace or multi-crystal furnace in large quantities.

The reasons are as follows:

Silicon (mono-crystal and multi-crystal) material with crystal structure has been widely used in semiconductor, solar, and integrated circuit industries. The silicon feedstock is usually produced by the processes of high-purity silicon feedstock melting and crystal growth. The utilized high-purity silicon feedstock is usually produced from silicon compounds (like trichlorosilane, silane, etc) by chemical vapor deposition at high temperature.

High-purity silicon feedstock produced by silicon feedstock manufacturers has two main forms, bulk/rod and rough graininess. Bulk/rod silicon feedstock is normally produced by breaking up high-purity big silicon rod or silicon ingot. Rough graininess silicon feedstock is produced by fluidized bed process of chemical vapor deposition. The diameter of these grains is normally within a range of several hundred micrometers to millimeter-sized. The two forms of silicon feedstock are convenient for transportation, and its tap density in crucible used for crystal growth is high whose filling factor is usually greater than 50%. Therefore, the two forms of silicon feedstock are widely utilized in industrial production.

Rough graininess silicon usually comes from fluidized bed process. It will also produce extremely fine silicon powder having a particle size within a range of a submicrometer to several hundred micrometers, which is the byproduct of rough graininess silicon. In addition, there is another kind of silicon powder having a particle size of micrometer and submicrometer grade produced by silane gas pyrolysis at a high temperature. Fine silicon powder usually relates to the process of cyclone dust collection or filter powder deposition, and the particle size range of the two kinds of silicon powder are usually not the same.

However, extremely fine silicon powder, currently the byproduct produced by fluidized bed process or other processes, is difficult utilized in the field of crystal growth or other fields. The main reasons are as follows: first, fine powder flows easily with gases. During crystal growth or other processes, the device is first vacuumized, then the appropriate protective gases are charged into the device. Because the particle size of the powder is small and light, it flows easily with the gases in every direction during the process of vacuumizing and charging protective gas. These powders damage the device component, as well as influence on the stability of the process and product, or can even lead to serious accident. Also, when operation staff breathes in flowing powder during the charging process, they are exposed to some occupational diseases like silicosis, etc. Second, tap density is small. The particle size of the fine powder is small so it has a low loose density. More room is needed during transportation and storage. More importantly, it is impossible to charge any more feedstock during crystal growth. Powder feedstock cannot be re-charged, since the powder flows easily with gases. Fine silicon powder for example, has a loose density within a range of 0.25 g/cm$^3$ to 1 g/cm$^3$, which is much lower than the pure silicon brick having a density of 2.33 g/cm$^3$. The result is a very small charging capacity. A square crucible with internal size 69 cm×69 cm×42 cm can charge 240 kilograms to 300 kilograms silicon feedstock, but no more than 150 kilograms of silicon powder. Third, silicon powder easily oxidizes or has other reactions in air because the particle size of fine powder is small, but has a large specific surface area. Silicon powder easily oxidizes in air, and one layer of oxide film forms on the surface of the silicon powder. Furthermore, fine silicon powder easily gets damp in the air, and the adsorbed moisture will encourage further oxidation. These oxides will cause problems to subsequent processes. For instance: silicon feedstock melts with difficulty; volatile matter reacts with the equipment; and the quality of crystal and final products like chips and solar cells are reduced. Consequently, the utilization of extremely fine silicon powder in crystal growth is restricted.

For the above reasons, even though the purity of fine silicon powder produced by fluidized bed process is high, it has not been widely used. Currently, there is no effective way to utilize fine silicon powder.

In order to develop the application of silicon powder, the invention has done the following experiment. The steps are as follows. First, high-purity silicon powder having the period of transportation and storage for 4 months is charged into a mono-crystal furnace or multi-crystal furnace. The process of finishing crystal growth takes 30 hours to 60 hours by tolerating that flowing dust damages the device seriously. Then the silicon crystal is sliced, its properties are tested. The results show that the crystal cannot totally meet the quality requirements of solar cells. The silicon crystal must be charged into mono-crystal furnace or multi-crystal furnace again to finish the process of crystal growth for another 30 hours to 60 hours. Then the silicon crystal is tested once again. After the second processing in the furnace the quality requirements of solar cells are met. However, the cost processing the silicon crystal growth is unbearable for the manufacturers.

In recent years, the development of the semiconductor and photovoltaic industry, has worsened the serious shortage of silicon feedstock. Silicon feedstock has become a determinant of the development of these industries. Thus, a viable and feasible method to utilize these high-purity and extremely fine silicon powder effectively is highly sought after. This method is important to the reduction of production cost, competition enhancement, and promotion of the industry development, especially popularization of photovoltaic product in large scale.

Moreover, since it takes a long time to accomplish crystal growth process in a mono-crystal furnace or multi-crystal furnace, it is meaningful for production efficiency improvement and energy conservation to try to increase crucible charging capacity.

American U.S. Pat. No. 7,175,685 is a technology that is most similar with the invention.

In U.S. Pat. No. 7,175,685, it has found the importance of taking full utilization of silicon powder. U.S. Pat. No. 7,175,685 puts forward a technical solution to increase crucible charging capacity by increasing the density of silicon powder by simple dry pressing method. However, we found that the technical solution of U.S. Pat. No. 7,175,685 ignores the disadvantage that silicon bricks made by simple dry pressing method is easily cracked, and the problem of silicon powders falling off the local surface of silicon brick easily.

The abstract of U.S. Pat. No. 7,175,685. "A bulk silicon material for making silicon ingots, consisting of silicon pellets, and a method for making the pellets from an agglomerate-free source of high purity silicon powder by feeding a controlled amount of silicon powder that is free of intentional additives and binders into a pellet die, and dry compacting the powder at ambient temperature with pressure to produce a pellet that has a density of about 50-75% of the theoretical density of elemental silicon, a weight within a range of about 1.0 gram to about 3.0 grams and preferably of about 2.3 grams, a diameter in the range of 10 mm to 20 mm and preferably of about 14 mm, and a height in the range of 5 mm to 15 mm and preferably of about 10 mm."

In claim 23 of U.S. Pat. No. 7,175,685, "The method for making a silicon pellet according to claim 13 wherein said step of dry compressing comprises applying a force greater than or equal to about approximately 10,000 Newton's to said powder."

In claim 8 of U.S. Pat. No. 7,175,685, "The silicon pellet for making silicon ingots according to claim 1, said pellet having a diameter of about approximately 14 mm, and a height of about approximately 10 mm."

In claim 12 of U.S. Pat. No. 7,175,685, "A silicon pellet for making silicon ingots, comprising a dry compacted volume of silicon powder compacted by a force of at least approximately 10,000 Newton's, said powder being free of intentional additives and binders, said pellet having a density of about approximately 60-75% of the theoretical density of elemental silicon, and having a weight of about approximately 2.3 grams, said pellet having a diameter of about approximately 14 mm, and a height of about approximately 10 mm."

Even the pressure parameter given by U.S. Pat. No. 7,175,685 is 10,000 Newton's, but area of thrust surface of 10,000 Newton's is not mentioned in the full text. It has not pointed out the working pressure of machine, and area of thrust surface of silicon brick as well. The conclusion of the full text of U.S. Pat. No. 7,175,685 is that the technical solution of this patent is to produce cylindrical silicon brick having a diameter of about approximately 14 mm, and a height of about approximately 10 mm by dry pressing method. This is a typical pressing technology similar to drug pressing.

This manner of dry pressing with single-direction, is a simple and vivid simulating technology of medicinal powder pressing. A certain amount of silicon powder is charged into cylindrical die. The top or the bottom of cylindrical die is pressurized to obtain a cylindrical silicon brick having a increased density, which is known as single-direction or bidirectional dry pressing. However, the increase of silicon density is limited using the single-direction or bidirectional dry pressing method because the range of pressurizing from the pressing machine is low and the force and the manner of pressurizing are limited. However, the pressure transmissibility of silicon powder is poor, which forms a great pressure gradient in the formed silicon brick. The middle area of the silicon brick has low pressure because it cannot be tightly-compacted. Consequently, when taking the formed silicon brick out from the die, it is easily cracked, which restricts the application of silicon brick.

For example, a cylindrical die is filled with silicon powder with average diameter of 10 micrometers, and then opened the die to obtain a cylindrical silicon brick by simulating bidirectional dry pressing on medicinal powder. Uneven pressure on silicon powder makes formed silicon brick with uneven density. For example, density on the top of the cylindrical silicon brick is greater than the middle of the cylindrical silicon brick. There is even a big crack and other defects in the middle portion of the cylindrical silicon brick. The cylindrical silicon brick is still easily cracked and has the problem of flowing silicon dust. If it is charged into a mono-crystal furnace or multi-crystal furnace, the silicon dust will easily flow with the protective gases that will seriously influence the regular production.

The medicinal powder dry pressing method to press silicon powder into silicon brick, yields a silicon brick with the solid density of 0.9 $g/cm^3$ to 1.7 $g/cm^3$. Since the internal structure of the silicon brick is uneven, sometimes there is some silicon powder falling off from the surface of the silicon brick and, sometimes a majority of the silicon brick produced from the cylindrical die is cracked and returns to a state of silicon powder. The silicon bricks can be easily broken and cracked during transportation and delivery, which is harmful to its application in a mono-crystal furnace or multi-crystal furnace.

The compression resistance of a silicon brick sample having a density of 0.9 $g/cm^3$ to 1.9 $g/cm^3$ pressed by single-direction or bidirectional dry pressing method underperforms. The silicon brick can even be cracked by a slight touch of the finger.

Claim 12 of U.S. Pat. No. 7,175,685 describes producing silicon brick without using a binders additive.

The applicant of the invention has developed specific binders for making silicon brick. The specific binders are mixed using a certain amount of polyvinyl alcohol and polyvinyl butyral or polyethylene glycol. They are added to silicon powder having an average diameter of 10 micrometers and a weight ratio of 0.1-10%. A large force (10 MPa to 100 MPa) is pressed on the top and bottom end of cylindrical die by bidirectional dry pressing method. However, the compression resistance of the obtained silicon brick still underperforms.

The compression resistance of silicon brick related to the invention is measured by putting a silicon brick having a certain size into the presser, and determining the compressive stress or pressure when the silicon brick is cracked.

In a simple experiment a modified medicinal powder pressing machine is used to show traditional medicinal powder pressing technology. Silicon powder is charged into a cylindrical die having a diameter of 20 mm and a length of 10 mm, and a pressing force of 10 Mpa is applied in a single-direction on the silicon powder. After pressurizing, the cylindrical silicon brick is taken out from cylindrical die, but the silicon brick is cracked and cannot be tested on its density and compression resistance.

In another experiment using the technology of traditional pressing, silicon powder is added into a cylindrical die having a diameter of 100 mm and a length of 300 mm, and a pressing force of 60 Mpa is applied in a single-direction on the silicon powder. After pressurizing, the silicon brick is removed from the cylindrical die but it is cracked in the middle and there is a small amount of silicon powder falling off the surface. The density deviation between a silicon brick having a volume of 1 $cm^3$ from the pressurizing contacting interface and having a density of 1.68 g/cm$^3$ and a silicon brick having a volume of 1 cm$^3$ at a distance of 60 cm from the pressurizing contacting interface and having a density of 1.33 g/cm$^3$, is about 21%. However, the middle position of cylindrical silicon brick at a distance of 150 cm from the pressurizing contacting interface of silicon brick is cracked. The density of the cracked point is taken as 0, and density deviation of those two silicon bricks is 100%. The sample for compression resistance test is cracked in the process of production and cannot be tested.

the sintering method is very high. Thus its production cost is extraordinary high. The compression resistance of silicon brick using this method is close to that of silicon brick having a relative density of 100% and a real density of 2.33 g/cm$^3$ produced by vapor deposition method. Or the compression resistance of high density silicon brick produced by the sintering method is close to that of the waste high-purity silicon brick recycled from semiconductor or solar industry and having the casting process.

TABLE I

Compression resistance of diversified silicon bricks in current technical field

| Every variety of high-purity silicon raw material | Recycled waste silicon brick | Bulk, flaky and rough graininess silicon brick | Silicon brick produced by sintering method |
|---|---|---|---|
| Source | High-purity waste silicon brick recycled from semiconductor, solar industry, etc. | The silicon brick is produced from big silicon brick by process of slicing or being cracked, and the big silicon brick is produced from upstream manufacturer of photovoltaic and semiconductor industry by vapor deposition method for instance. | Silicon brick produced by sintering method. For example, at temperature of 1200-1412° C. at atmospheric pressure of 1000 KPa. |
| Compression resistance | Good compression resistance. For instance, 60-206 Mpa or higher. | Good compression resistance. For instance, 60-206 Mpa or higher. | Good compression resistance. For instance, 55 Mpa or higher. |
| Relative density | 100% | 100% | About 99%. |

Even though U.S. Pat. No. 7,175,685 could press silicon powder into forming constrainedly, its compression resistance so poor, that it cannot compression resistance tested.

Even though the dry pressing technology of U.S. Pat. No. 7,175,685 can obtain silicon brick with density greater than the density of loose silicon powder, the filling property of the silicon bricks produced is poor. Their compression resistance is not optimal, and their internal density is uneven.

The dry pressing technology of U.S. Pat. No. 7,175,685 can obtain silicon brick with density greater than the density of loose silicon powder, but its low compression resistance will cause the problem of flowing silicon dust. Also, silicon brick is easily cracked during the process of discharging, transportation and charging into a mono-crystal furnace or multi-crystal furnace from the die. The dry pressing technology of U.S. Pat. No. 7,175,685 does not completely resolve the problems of flowing silicon dust or cracking silicon brick.

There are no technical suggestions given by U.S. Pat. No. 7,175,685 about preventing silicon powder or silicon brick from contacting the air and producing oxide film.

Fifth, the present invention introduces silicon brick produced by sintering method. The existing technology of CN2008100314982 involves sintering metallurgical silicon with purity of 99.0% to 99.9% at temperature of 1050° C. to 1150° C. The existing technology of JP2004284929A involves sintering at temperature of 1200° C. to 1412° C. at atmospheric pressure of 1000 KPa to obtain silicon brick having a relative density of 99.9% which is used in the semiconductor industry.

With the sintering method it is possible to obtain silicon brick of high density at temperature of higher than 1000° C. or even at temperatures close to the melting point of silicon. The production facility requirement and energy consumption of Sixth, there are some reports in the existing technology of pressing silicon powder into silicon brick using isostatic pressing as well. For example, the Ceramic Journal Vol. 27 No. 2 June. 2006, "Effects of the amount of water and binder on cold isostatic pressing forming ability and performance of green body" describes a method using a uniform mixture of silicon powder (granularity≦0.044 mm) and polyvinyl alcohol solution (PVA, 5 wt %) in a certain proportion. After sieving, prilling, vibration packing and cold isostatic pressing, the green body is pressed. This article describes research to improve on isostatic pressing by adding polyvinyl alcohol and research on the effects of the amount of water and binder on forming ability and performance of silicon powder green body. However, this reference doesn't describe silicon brick produced from silicon powder by isostatic pressing to be utilized in a mono-crystal furnace or multi-crystal furnace as raw material of silicon crystal growth.

US20070014682 also describes producing silicon brick by dry pressing method with binders and using it in the process of silicon melting. However, US20070014682 isn't related to isostatic pressing technology.

DESCRIPTION OF THE INVENTION

One objective of the invention is to provide an application method of silicon powder and raw material silicon brick with good filling property in a mono-crystal furnace or a multi-crystal furnace. More particularly, the method comprises first pressing silicon powder into raw material silicon brick with good filling property by cold isostatic pressing or hot isostatic pressing, then charging it into a mono-crystal furnace or a multi-crystal furnace as the original raw material for silicon crystal growth.

In this method silicon powder having a particle size within a range of 0.1 micrometer to 1000 micrometers is pressed into silicon brick by cold isostatic pressing or hot isostatic pressing, and then charged it into a mono-crystal or multi-crystal furnace for silicon crystal growth.

The raw material silicon brick with good filling property in a mono-crystal furnace or multi-crystal furnace, has a purity within a range of 99.99% to 99.9999999%, and its compression resistance parameter is within a range of 0.1 Mpa to 50 Mpa.

Pressing silicon powder into silicon brick by cold isostatic pressing or hot isostatic pressing, can mitigate various negative influences caused by the oxidation of silicon powder. Using this method, the silicon brick produced from silicon powder by cold isostatic pressing or hot isostatic pressing can be stored for more than one year or even three to five years without impairing the quality of solar cell with the production of oxide film.

Even though the density of the silicon brick produced from silicon powder by cold isostatic pressing or hot isostatic pressing and the raw material silicon brick with good filling property provided by the present invention is lower than 2.33 g/cm$^3$, its consistency is good when its compression resistance parameter is 0.1 Mpa. Its internal structure is not compact but it is sufficiently compacted to avoid the inside being oxidized by air. The small amount of oxidation on the surface of raw material silicon brick with good filling property has no distinct negative influence on the quality of solar cells.

To investigate the application of the silicon brick produced from silicon powder by cold isostatic pressing or hot isostatic pressing or the raw material silicon brick with good filling property according to the present invention, the following experiment was conducted: the silicon brick produced from silicon powder by cold isostatic pressing or hot isostatic pressing or the raw material silicon brick with good filling property is charged into a mono-crystal furnace or a multi-crystal furnace; then crystal growth is conducted for 30 hours to 60 hours; and the silicon crystal is taken out and cut for testing. After testing, the silicon brick properties meet the quality requirements of solar cells. The silicon crystal growth process of the invention is more cost efficient than the prior art.

Density and compression resistance properties of the silicon brick produced from silicon powder by cold isostatic pressing or hot isostatic pressing or the raw material silicon brick with good filling property of the present invention and those of the traditional silicon brick are listed in Table II.

TABLE II

Comprehensive comparison of high-purity raw material silicon with different forms in a mono-crystal furnace or multi-crystal furnace

| Different forms of high-purity raw silicon | Silicon powder | Recycled waste silicon brick | Bulk, flaky and rough grained silicon brick | Silicon brick with poor compression resistance | Raw silicon brick with good compression resistance provided by the present invention |
|---|---|---|---|---|---|
| Source | It's produced from the upstream manufacturer of photovoltaic and semiconductor industry by, for example, Siemens method, pyrolysis of silane, hydrogen reduction of SiCl$_4$ or other chemical vapor deposition methods. | High-purity waste silicon brick recycled from semiconductor or solar industry, etc. | The silicon brick is produced from large silicon brick, which is produced from upstream manufacturer of photovoltaic and semiconductor industry, by cutting or cracking. | 1. Silicon brick produced from silicon powder which is produced from the upstream manufacturer of photovoltaic and solar industry by simulating pressing method of medicinal industry. 2. Silicon brick with poor compression resistance produced by other methods. | 1. Silicon brick with good compression resistance produced from silicon powder which is produced from upstream manufacturer of photovoltaic and solar industry by one method of cold isostatic pressing, hot isostatic pressing, single-direction hot dry pressing, bidirectional hot dry pressing, and adding additives, etc. 2. Silicon brick with good compression resistance produced by other methods. |
| Density | Loose density is 0.25-1.00 g/cm$^3$ | About 2.33 g/cm$^3$ | About 2.33 g/cm$^3$ | Lower than 2.33 g/cm$^3$ | Lower than 2.33 g/cm$^3$ |
| Crucible utilization | Very low crucible effective utilization of charging. | High crucible effective utilization of charging. | High crucible effective utilization of charging. | Low crucible effective utilization of charging. | High crucible effective utilization of charging. |
| Compression resistance | Silicon powder is loose, and it couldn't test its compression resistance according to the method offered by the invention. | Good compression resistance. | Good compression resistance. | Poor compression resistance. | Good compression resistance. |
| Real application effect in crucible | Its application is restricted by a large margin because that silicon dust flowing and other | Can be utilized in normal | Can be utilized in normal | Being oxidized is unavoidable, which makes its application restricted by a large margin. Because of silicon dust flowing, | Can be utilized in crucible normally as a new application. |

TABLE II-continued

Comprehensive comparison of high-purity raw material silicon with different forms in a mono-crystal furnace or multi-crystal furnace

| Different forms of high-purity raw silicon | Silicon powder | Recycled waste silicon brick | Bulk, flaky and rough grained silicon brick | Silicon brick with poor compression resistance | Raw silicon brick with good compression resistance provided by the present invention |
|---|---|---|---|---|---|
| | problems. We can only add a small amount of silicon powder into bulk, flaky and rough graininess silicon brick or recycled waste silicon brick as auxiliary raw materials. | | | being cracked and other problems, its application is restricted by a large margin as well. | |

Silicon brick having a density of 2.33 g/cm³ is basically produced from raw material silicon by melting silicon at high temperature and then cooling the liquid down. Its internal structure arrangement is compact, and its microstructure is unique.

The loose density of high-purity silicon powder without any treatment is 0.25 g/cm³ to 1.00 g/cm³. Its internal structure arrangement is not compact, and its microstructure is unique as well.

The loose density of high-purity silicon powder can be increased by pressure treatment, but the density is lower than 2.33 g/cm³. Its microstructure is unique as well.

The crucible mentioned in the invention is the container for charging raw material silicon into a mono-crystal furnace or multi-crystal furnace. The raw material silicon brick can be used in a mono-crystal furnace or multi-crystal furnace without crucible as well. The invention is applicable to any kind of mono-crystal furnace or multi-crystal furnace.

The microstructures of the different forms of silicon above are greatly different. The images of their microstructures have qualitative differences.

The normal dry pressing technology offered by U.S. Pat. No. 7,175,685 simulates the normal single-direction dry pressing or bidirectional dry pressing technology of pharmaceutical powder for curing diseases. However, the composition of normal pharmaceutical powder for curing diseases includes abundant organic composition. The organic composition easily agglomerates and flakes, and it can be pressed using a minor force. And most pharmaceutical powder with organic composition doesn't require heating in the pressing process.

The difference in the binding ability of silicon powders and that of pharmaceutical powders with organic composition is great and is determined by the nature of materials. Silicon powder at normal temperatures mainly gives expression of the nature of inorganic material.

Single-direction or bidirectional dry pressing technology used to press pharmaceutical powder results in a large pressure gradient in the formed silicon brick, because the range of pressurizing from the pressing machine is low and the force and the manner of pressurizing are limited. There is a big low-pressure area in the middle of the silicon brick, so that the silicon powder cannot be tightly compacted. Eventually, the silicon brick will crack or silicon powder falls off from the surface of the brick.

To obtain silicon brick which has resistance to cracking or resistance to silicon powders falling from the surface, silicon powder is pressed into silicon brick with the compression resistance parameter of 3 Mpa by cold isostatic pressing or hot isostatic pressing. Furthermore, silicon bricks with the compression resistance parameter of 0.1 Mpa to 50 Mpa have better resistance to cracking and silicon powders falling from the surface.

The compression resistance of the invention is measured by putting at least 1 gram of silicon brick with arbitrary quality, into the compression machine for test. The compression resistance is given by the pressure gauge reading after at least two bricks are broken, or the compressive load greatly declines.

Experimental data on the compression resistance related to the invention can be found in the Chinese National Standard GB/T8480-2006 Experimental method of fine ceramic compressive strength. The detailed experimental method of fine ceramic compressive strength is in the attachment of the invention.

Hot dry pressing involves setting up heating parts on the exine of the dry pressing die. When pressure is applied on one end or two ends of the die, the die and the material inside is heated up. For instance, if we heat the die up to 600° C. to 1400° C., pressurize it to 1 Mpa to 100 Mpa, and keep the temperature and pressure for 10 minutes to 120 minutes, then silicon powder in the cylindrical die is softened by heat so that it is close to liquid. Once the softened fluid is compressed evenly, and various properties of the entire silicon brick are uniform, its compression resistance is especially good.

Cold isostatic pressing means a forming technology by pressing equal force on all the directions of material. Normally, the force of cold isostatic pressing is more than that of single-direction or bidirectional dry pressing. With the evenness of cold isostatic pressing, various properties of the silicon brick are uniform, and the resulting compression resistance.

Hot isostatic pressing is based on cold isostatic pressing technology. By setting up a heating system, the material is formed after heating and pressurizing. The added heating process makes hot isostatic pressing superior to cold isostatic pressure.

In order make silicon brick easy to aggregate, a certain appropriate proportion of organic binders can be added. However, adding a certain proportion of organic binders has a negative influence on the manufacture of solar grade and semiconductor grade silicon wafer such as impurities. We eventually have to find an appropriate method to remove these binders. Consequently, technology of adding binders belongs to the subordinate techniques.

Raw material silicon brick with good filling property can be obtained because the organic binders applied to solar or semiconductor industry can volatilize after heating in the subsequent treatment. Thus the organic binders do not have an influence on the purity of raw material silicon brick with good filling property.

The first embodiment of good filling property is the surface area in the air is far less than that of silicon powder, and the degree of being oxidized or contaminated is lower than that of silicon powder, namely, the amount of oxidized or contaminated silicon is less than that of loose silicon powder. Silicon loss and the related costs are reduced as a result. The speed of being oxidized or contaminated is lower than that of loose silicon powder, which prolongs the storage life of silicon. Storage life of loose silicon powder stored at normal temperature and normal pressure is merely 3 months to 6 months. The invention also reduces the required storage environment. Some semiconductor or photovoltaic companies have to store silicon powder under low pressure and low temperature with inert gas so as to prolong storage life of loose silicon powder. The cost of this storage method is very high and uneconomical. Silicon brick with good filling property offered by the invention does not require a harsh or expensive storage environment. It even saves time during the process of cleaning off oxides or impurities on the surface by chemical solution, and reduces the consumption of chemical solution.

The second embodiment of good filling property is the compression resistance of raw material silicon brick with good filling property in the invention is superior to that of traditional silicon brick. Silicon brick with poor compression resistance produced from silicon powder by simulating the pressing method of medicine field has a very restricted application. If the compression resistance of raw material silicon brick in the invention is good, the problem of being cracked and silicon dust flowing easily when taking raw material silicon brick out from the die, in the process of transportation and storage, charging into the crucible, and supplement into a mono-crystal furnace or multi-crystal furnace will be reduced.

The third embodiment of good filling property is its filling density that is higher than that of loose silicon powder. More raw material silicon can be charged in the heat-resistant crucible of a mono-crystal furnace or multi-crystal furnace. Because it takes a long time to accomplish the whole growth process in a mono-crystal furnace or multi-crystal furnace, about dozens of hours in general. Thus it is quite significant to increase crucible charging capacity for production efficiency improvement and energy conservation.

The following are technical solutions of the application of silicon powder provided by the invention:

An application method of silicon powder in a mono-crystal furnace or a multi-crystal furnace comprising: pressing silicon powder having a particle size of 0.1 micrometer to 1,000 micrometers into silicon brick by cold isostatic pressing or hot isostatic pressing, then charging it into a furnace for silicon crystal growth.

An application method of silicon powder as the original raw material of silicon crystal growth comprising: pressing silicon powder having a particle size of 0.1 micrometer to 1,000 micrometers into silicon brick by cold isostatic pressing or hot isostatic pressing, then charging it into a furnace for silicon crystal growth, which is used as the original raw material of silicon crystal growth.

The use of silicon powder as the original raw material of silicon crystal growth, wherein the silicon crystal growth is the silicon crystal growth for the solar or semiconductor industry.

The use of silicon powder as the original raw material of silicon crystal growth, wherein the furnace for silicon crystal growth is a mono-crystal furnace for growing monocrystalline silicon or a multi-crystal furnace for growing polycrystalline silicon.

An application method of silicon powder in a mono-crystal furnace or a multi-crystal furnace comprising: pressing silicon powder having a particle size of 0.1 micrometer to 1,000 micrometers into silicon brick by cold isostatic pressing or hot isostatic pressing, then charging it into the mono-crystal furnace or the multi-crystal furnace as the original raw material of silicon crystal growth.

An application method of silicon powder in a mono-crystal furnace or a multi-crystal furnace comprising: pressing silicon powder having a particle size of 0.1 micrometer to 1,000 micrometers into silicon brick by cold isostatic pressing or hot isostatic pressing, then charging it into the mono-crystal furnace or the multi-crystal furnace as the original raw material of silicon crystal growth in solar or semiconductor field.

An application method of silicon powder in a mono-crystal furnace or a multi-crystal furnace comprising: pressing silicon powder having a particle size of 0.1 micrometer to 100 micrometers into silicon brick having a weight of 0.2 gram to 2,000,000 grams by cold isostatic pressing or hot isostatic pressing, then charging it into a mono-crystal furnace or a multi-crystal furnace.

An application method of silicon powder in a mono-crystal furnace or a multi-crystal furnace, wherein the silicon powder has a purity of 99.9% to 99.9999999999%.

An application method of silicon powder in a mono-crystal furnace or a multi-crystal furnace, wherein the silicon powder has a purity of 99.99% to 99.9999999%.

An application method of silicon powder in a mono-crystal furnace or a multi-crystal furnace, wherein the silicon powder has a purity of 99.999% to 99.999999%.

An application method of silicon powder in a mono-crystal furnace or a multi-crystal furnace comprising: adding a binder to silicon powder in a weight ratio of 0-10.000%, then pressing it into silicon brick by cold isostatic pressing or hot isostatic pressing.

An application method of silicon powder in a mono-crystal furnace or a multi-crystal furnace, wherein the pressure of cold isostatic pressing is 10 MPa to 800 MPa.

An application method of silicon powder in a mono-crystal furnace or a multi-crystal furnace, wherein the pressure of hot isostatic pressing is 10 Mpa to 800 Mpa, and the temperature is 30° C. to 1,400° C.

An application method of silicon powder in a mono-crystal furnace or a multi-crystal furnace, wherein the pressure of hot isostatic pressing is 10 Mpa to 800 Mpa, and the temperature is 50° C. to 500° C.

An application method of silicon powder in a mono-crystal furnace or a multi-crystal furnace, wherein the pressure of hot isostatic pressing is 10 Mpa to 800 Mpa, and the temperature is 50° C. to 300° C.

An application method of silicon powder in a mono-crystal furnace or a multi-crystal furnace, wherein the silicon powder having a particle size of 0.1 micrometer to 1,000 micrometers is made by Siemens method, pyrolysis of silane, or hydrogen reduction of $SiCl_4$.

The main technical solutions of the application of raw material silicon brick with good filling property in the invention are as follows:

The use of a raw material silicon brick with good filling property in a mono-crystal furnace or a multi-crystal furnace, wherein the raw material silicon brick has a purity of 99.99% to 99.9999999%, and its compression resistance parameter is within a range of 0.1 Mpa to 50 Mpa.

The use of a raw material silicon brick with good filling property as the original raw material of silicon crystal growth, wherein the raw material silicon brick has a purity of 99.99% to 99.9999999%, and its compression resistance is 0.1 Mpa to 50 Mpa.

The use of a raw material silicon brick with good filling property in a mono-crystal furnace or a multi-crystal furnace, wherein the raw material silicon brick has a purity of 99.99% to 99.9999999%, and its compression resistance is 0.1 Mpa to 50 Mpa; which is charged into the mono-crystal furnace or the multi-crystal furnace as the original raw material of silicon crystal growth.

The use of a raw material silicon brick with good filling property in a mono-crystal furnace or a multi-crystal furnace, wherein the raw material silicon brick has a density of 0.8 g/cm$^3$ to 2.20 g/cm$^3$.

The use of a raw material silicon brick with good filling property in a mono-crystal furnace or a multi-crystal furnace, wherein the raw material silicon brick has a density of 1.2 g/cm$^3$ to 2.0 g/cm$^3$.

The use of a raw material silicon brick with good filling property in a mono-crystal furnace or a multi-crystal furnace, wherein the raw material silicon brick has a density of 1.5 g/cm$^3$ to 2.0 g/cm$^3$.

The use of a raw material silicon brick with good filling property in a mono-crystal furnace or a multi-crystal furnace, wherein the raw material silicon brick has a compression resistance of 0.2 Mpa to 30 Mpa.

The use of a raw material silicon brick with good filling property in a mono-crystal furnace or a multi-crystal furnace, wherein the raw material silicon brick has a compression resistance of 0.3 Mpa to 15 Mpa.

The use of a raw material silicon brick with good filling property in a mono-crystal furnace or a multi-crystal furnace, wherein the silicon powder used as raw material of the raw material silicon brick has a particle size of 0.1 micrometer to 1000 micrometers.

The use of a raw material silicon brick with good filling property in a mono-crystal furnace or a multi-crystal furnace, wherein the silicon powder used as raw material of the raw material silicon brick has a particle size of 1 micrometer to 100 micrometers.

The use of a raw material silicon brick with good filling property in a mono-crystal furnace or a multi-crystal furnace, wherein the density of the raw material silicon brick is even, and the density difference between any two points on any cross-section of the silicon brick is 0-18%.

The use of a raw material silicon brick with good filling property in a mono-crystal furnace or a multi-crystal furnace, wherein the density of the raw material silicon brick is even, and the density difference between any two points on any cross-section of the silicon brick is 0-15%.

The use of a raw material silicon brick with good filling property in a mono-crystal furnace or a multi-crystal furnace, wherein the density of the raw material silicon brick is even, and the density difference between any two points on any cross-section of the silicon brick is 0-10%.

The use of a raw material silicon brick with good filling property in a mono-crystal furnace or a multi-crystal furnace, wherein the density of the raw material silicon brick is even, and the density difference between any two points on any cross-section of the silicon brick is 0-8%.

The use of a raw material silicon brick with good filling property in a mono-crystal furnace or a multi-crystal furnace, wherein the density of the raw material silicon brick is even, and the density difference between any two points on any cross-section of the silicon brick is 0-5%.

The use of a raw material silicon brick with good filling property in a mono-crystal furnace or a multi-crystal furnace, wherein the density of the raw material silicon brick is even, and the density difference between any two points on any cross-section of the silicon brick is 0-3%.

The use of a raw material silicon brick with good filling property in a mono-crystal furnace or a multi-crystal furnace, wherein the raw material silicon brick with good filling property is produced from silicon powder by isostatic pressing.

The use of a raw material silicon brick with good filling property in a mono-crystal furnace or a multi-crystal furnace, wherein the raw material silicon brick with good filling property is produced from silicon powder by isostatic pressing, and the silicon powder is produced by Siemens method, pyrolysis of silane, hydrogen reduction of $SiCl_4$ or other chemical vapor deposition methods.

The use of a raw material silicon brick with good filling property in a mono-crystal furnace or a multi-crystal furnace, wherein the isostatic pressing has a working pressure of 100 Mpa to 800 Mpa.

The use of a raw material silicon brick with good filling property in a mono-crystal furnace or a multi-crystal furnace, wherein the micro structure of the raw material silicon brick is different from that of silicon ingot after melting or the raw material silicon brick produced by traditional dry pressing method.

The use of a raw material silicon brick with good filling property in a mono-crystal furnace or a multi-crystal furnace, wherein the raw material silicon brick with good filling property is produced by sintering forming method involving: first, mixing silicon powder or small silicon chunks with a binder in a weight ratio of 100:0-2.1, and with a grinding ball for 2 to 24 hours to make even, degassing under vacuum; and second, putting the mixture obtained from the above step into a container, after pressurizing the mixture with a pressure of 100 Mpa to 300 Mpa while maintaining a temperature of 100° C. to 120° C., sintering it for 2 to 4 hours at a temperature of 600° C. to 1,400° C. and eliminating the binder under vacuum conditions or under protection of inert gas, then cooling it down to room temperature and obtaining the raw material silicon brick with good filling property. The raw material of the binder is polyvinyl alcohol or polyvinyl butyral or polyethylene glycol, ethanol is added in a weight ratio of 5:1 to obtain the binder.

The use of a raw material silicon brick with good filling property in a mono-crystal furnace or a multi-crystal furnace, wherein the raw material silicon brick with good filling property is produced by the following processes: charging silicon powder or small silicon chunks into a cylindrical die with die set, then covering a guide die; wherein a heating interlayer is arranged outside the peripheral of the cylindrical die, and the heating interlayer is charged with heat conducting oil, a punch is corresponding to the guide die; pressurizing the silicon powder or small silicon chunk with a pressure of 10 Mpa to 800 Mpa for 0.1 to 1 hour while maintaining a temperature of 400° C. to 1,400° C., then cooling down to room temperature, and taking out the bulk product.

The use of a raw material silicon brick with good filling property in a mono-crystal furnace or a multi-crystal furnace, wherein the raw material silicon brick with good filling property is produced by the following method:
(1) mixing silicon powder or small silicon chunks with a binder in a weight ratio of 100:0.5, and with a grinding ball for 2 to 24 hours to make even, degassing under vacuum. The raw material of the binder is polyvinyl alcohol or polyvinyl butyral or polyethylene glycol, ethanol is added in a weight ratio of 5:1 to obtain the binder.

(2) putting the mixture obtained from the first step into a cylindrical die with a die set, then covering the guide die, wherein a heating interlayer is arranged outside the peripheral of the cylindrical die, and the heating interlayer is charged with heat conducting oil, a punch is corresponding to the guide die; pressurizing the mixture with a pressure of 30 Mpa to 50 Mpa for 0.1 to 0.5 hour while maintaining a temperature of 500° C. to 800° C., then cooling it down to room temperature, taking out the bulk product; eliminating the binder under a vacuum or under the protection of inert gas at a temperature of 600° C. to 1,400° C. to make the weight ratio of the residual binder 0-0.0001% based on the total weight of the bulk product; cooling down to room temperature.

The use of a raw material silicon brick with good filling property in a mono-crystal furnace or a multi-crystal furnace, wherein the raw material silicon brick with good filling property is produced by the following method: mixing silicon powder or small silicon chunk with a binder in a weight ratio of 100:0-10.0, and putting the mixture into a container made from soft packaging materials after mixing evenly, the raw material of the binder is polyvinyl alcohol or polyvinyl butyral or polyethylene glycol, ethanol is added in a weight ratio of 5:1 to obtain the binder.

The use of a raw material silicon brick with good filling property in a mono-crystal furnace or a multi-crystal furnace, wherein the raw material silicon brick with good filling property is produced by the following isostatic pressing method:
(1) making soft packaging materials into a container;
(2) charging silicon powder or small silicon chunks into the container, and sealing the container;
(3) putting the container into a liquid medium;
(4) pressurizing the liquid medium, in which the container is placed, by a pressing machine;
(5) stopping the pressurizing and taking the product out from the container.

Use of a raw material silicon brick with good filling property in a mono-crystal furnace or a multi-crystal furnace, wherein the raw material silicon brick with good filling property is produced by the following isostatic pressing method:
(1) making soft packaging materials into a container;
(2) charging silicon powder or small silicon chunks into the container, and sealing the container;
(3) putting the container into a liquid medium.
(4) pressurizing the liquid medium using a pressing machine with a pressure of 10 Mpa to 800 Mpa for 5 to 60 minutes while maintaining a temperature of 25° C. to 1,400° C.;
(5) stopping the pressurizing and taking the product out from the container.

Use of a raw material silicon brick with good filling property in a mono-crystal furnace or a multi-crystal furnace, wherein the raw material silicon brick with good filling property is produced by the following isostatic pressing method:
(1) making soft packaging materials into a container;
(2) charging silicon powder or small silicon chunks into the container, and sealing the container;
(3) putting the container into a liquid medium;
(4) pressurizing the liquid medium using a pressing machine with a pressure of 10 Mpa to 500 Mpa for 5 to 60 minutes while maintaining a temperature of 0° C. to 500° C.;
(5) stopping the pressurizing and taking the product out from the container;
(6) storing the product, the raw material silicon brick with good filling property, in a sealed bag for future use;
(7) opening the sealed bag, putting the raw material silicon brick with good filling property into the mono-crystal furnace or the multi-crystal furnace for the production of silicon crystal.

The use of a raw material silicon brick with good filling property in a mono-crystal furnace or a multi-crystal furnace, wherein charging fresh silicon powder produced by Siemens method, pyrolysis of silane, or hydrogen reduction of $SiCl_4$ into an isostatic pressing machine within 144 hours is performed for the completion of the isostatic pressing.

The use of a raw material silicon brick with good filling property in a mono-crystal furnace or a multi-crystal furnace, with the following steps:
(1) making soft packaging materials into a container;
(2) charging fresh silicon powder or small silicon chunks produced by Siemens method, pyrolysis of silane, or hydrogen reduction of $SiCl_4$ into the container within 2 hours, and sealing the container;
(3) putting the container into a liquid medium;
(4) pressurizing the liquid medium, using a pressing machine with a pressure of 150 Mpa for 20 minutes at room temperature;
(5) stopping the pressurizing and taking the product out from the container;
(6) storing the product, the raw material silicon brick with good filling property, into a sealed bag for future use;
(7) opening the sealed bag, putting the raw material silicon brick with good filling property into a mono-crystal furnace or multi-crystal furnace for the production of silicon crystal.

A yield of 0.2 gram, 0.3 gram, 1 gram or 10 grams of silicon brick can be obtained by adopting small die.

There are records available in the existing technology to produce a graphite crucible having a weight of 300,000 grams to 400,000 grams by isostatic pressing method. Consequently, it is totally feasible to produce silicon brick having a weight of 0.2 gram to 500,000 grams.

As isostatic pressing technology develops rapidly, the weight and volume of the product is increasing. It is feasible to produce silicon brick having a weight of 2,000,000 grams.

The anti-oxidation advantage of the invention can be represented by the following experimental results:

TABLE III

Effect of various isostatic pressing working technical parameter

| Isostatic pressing working technical parameter | 10 MPa | 30 MPa | 50 MPa | 150 MPa | 250 MPa | 500 MPa | 1000 MPa |
|---|---|---|---|---|---|---|---|
| Superficial area explored in the air | Many | Moderate | Moderate | Few | Few | Few | Few |
| Degree of being oxidized or contaminated | High | Moderate | Moderate | Low | Low | Low | Very low |

TABLE III-continued

Effect of various isostatic pressing working technical parameter

| Isostatic pressing working technical parameter | 10 MPa | 30 MPa | 50 MPa | 150 MPa | 250 MPa | 500 MPa | 1000 MPa |
|---|---|---|---|---|---|---|---|
| Weight ratio of oxidized or contaminated silicon amount to the total amount | High | Moderate | Moderate | Low | Low | Low | Very low |
| Impact to crystal growth after being stored at normal temperature and pressure with air around for 10 months | No negative impact to silicon crystal growth | No negative impact to silicon crystal growth | No negative impact to silicon crystal growth | No negative impact to silicon crystal growth | No negative impact to silicon crystal growth | No negative impact to silicon crystal growth | No negative impact to silicon crystal growth |
| Estimated storage life at normal temperature and normal pressure with air around | 3-5 years | 3-5 years | 5 years | 5-10 years | 8-10 years | 10-20 years | Dateless |
| Chemical solution consumption after being stored for 1 year | Many | Little | Little | Very little, it can almost go without chemical solution cleaning | Very little, it can almost go without chemical solution cleaning | Very little, it can almost go without chemical solution cleaning | Very little, it can almost go without chemical solution cleaning |
| Time for chemical solution cleaning after being stored for 1 year | Long | Short | Short | Very short, it can almost go without chemical solution cleaning | Very short, it can almost go without chemical solution cleaning | Very short, it can almost go without chemical solution cleaning | Very short, it can almost go without chemical solution cleaning |

After a certain period of storage, the weight ratio of oxidized or contaminated silicon amount to the total amount is higher than 97%, and the period of storage time is the storage life mentioned in the present invention.

Once isostatic pressing is used with pressure higher or equal to 150 Mpa, the degree of being oxidized or contaminated is low, and the proportion of oxidized or contaminated silicon out of the total amount is small. The reason is during the process of cleaning off oxides or polluting impurities by chemical solution, there is a risk of introducing new impurities. Consequently, it is almost not necessary for a silicon brick with good filling property produced by isostatic pressing with a pressure of higher or equal to 150 Mpa to undergo a cleaning process with chemical solution to remove oxides or polluting impurities. It is not recommended to set isostatic pressing pressure higher or equal to 1,000 Mpa because the condition is too severe for an isostatic pressing device.

TABLE IV

Compression resistance parameter effect of silicon brick after isostatic pressing

| Compression resistance parameter of silicon brick | 0.01 MPa | 0.1 MPa | 1 MPa | 3 MPa | 10 MPa | 30 MPa | 50 MPa | 70 MPa |
|---|---|---|---|---|---|---|---|---|
| Superficial area explored in the air | Many | Moderate | Moderate | Moderate | Few | Few | Few | Very few |
| Degree of being oxidized or contaminated | High | Moderate | Moderate | Lower | Low | Low | Low | Very low |
| Weight ratio of oxidized or contaminated silicon to the total amount | High | Moderate | Moderate | Lower | Low | Low | Low | Very low |
| Impact to crystal growth after being stored at normal temperature and pressure with air around for 10 months | No negative impact to silicon crystal growth | No negative impact to silicon crystal growth | No negative impact to silicon crystal growth | No negative impact to silicon crystal growth | No negative impact to silicon crystal growth | No negative impact to silicon crystal growth | No negative impact to silicon crystal growth | No negative impact to silicon crystal growth |

TABLE IV-continued

Compression resistance parameter effect of silicon brick after isostatic pressing

| Compression resistance parameter of silicon brick | 0.01 MPa | 0.1 MPa | 1 MPa | 3 MPa | 10 MPa | 30 MPa | 50 MPa | 70 MPa |
|---|---|---|---|---|---|---|---|---|
| Estimated storage life at normal temperature and pressure with air around | 3-5 years | 3-5 years | 5 years | 5-10 years | 8-10 years | 10-20 years | Dateless | Dateless |
| Chemical solution consumption after being stored for 1 year | Many | Less | Less | Very few, it can almost go without chemical solution cleaning | Very few, it can almost go without chemical solution cleaning | Very few, it can almost go without chemical solution cleaning | Very few, it can almost go without chemical solution cleaning | Very few, it can almost go without chemical solution cleaning |
| Time for chemical solution cleaning after being stored for 1 year | Long | Short | Short | Short | Very short, it can almost go without chemical solution cleaning | Very short, it can almost go without chemical solution cleaning | Very short, it can almost go without chemical solution cleaning | Very short, it can almost go without chemical solution cleaning |

Once the compression resistance of a silicon brick is higher or equal to 10 Mpa, the degree of being oxidized or contaminated is low, and the proportion of the silicon that is oxidized or contaminated in the total amount is small. The reason is that during the process of cleaning off oxides or polluting impurities by chemical solution, there is a risk of introducing new impurities. Consequently, it is almost not necessary for a silicon brick with good filling property with compression resistance higher or equal to 10 Mpa to undergo a cleaning process with chemical solution to remove oxides or polluting impurities. It is not recommended to obtain the silicon brick with compression resistance parameter higher or equal to 70 Mpa because the condition is too severe for an isostatic pressing device.

Interpretation of Related Technologies

The source of raw material silicon brick with good filling property can be traditional small silicon wafer treated by the method of the invention, and it can also be a large amount of silicon powder produced by Siemens method, pyrolysis of silane, hydrogen reduction of $SiCl_4$ or other chemical vapor deposition methods, and treated by the method of the invention. Raw material silicon brick with good filling property is also available from other sources.

The average diameter of silicon powder produced by Siemens method, pyrolysis of silane, hydrogen reduction of $SiCl_4$ or other chemical vapor deposition methods is 0.1 to 1000 micrometers normally.

Other Advantages of the Invention:

(1) Because the invention can use the silicon powder produced by Siemens method, pyrolysis of silane, hydrogen reduction of $SiCl_4$ or other chemical vapor deposition methods to produce raw material silicon brick with good filling property by isostatic pressing or other methods, it increases the available raw material source for silicon solar cells. It turns silicon powder that is difficult to be utilized into an important raw material source for silicon solar cells. It is of great significance since silicon raw material is in short supply.

(2) Raw material silicon brick with good filling property has appropriate density, which can increase the applied volume of heat-resistant crucible. For example, the commonly used DSS-240 polycrystalline silicon directional casting furnace produced by American GT Solar Technologies, Inc., has a crucible that is 69 cm×69 cm×42 cm. When charging silicon raw material by heaping, small silicon wafer can only produce 80 to 120 kilograms of monocrystalline or polycrystalline silicon ingot. However, the raw material silicon brick can produce 220 to 300 kilograms of monocrystalline or polycrystalline silicon ingot. Adopting raw material silicon brick with good filling property for use in a mono-crystal furnace or multi-crystal furnace greatly reduces energy consumption and costs.

The invention overcomes the problem of unfavorable compression resistance of silicon brick produced by the traditional dry pressing method of U.S. Pat. No. 7,175,685. By adopting cold isostatic pressing or hot isostatic pressing method, silicon powder will receive more uniform force in all directions. The hot isostatic pressing method and hot dry pressing method yields a silicon brick with a better compression resistance and a uniform internal density with an improved structure.

Silicon brick with better compression resistance does not crack easily and does not have the problem of silicon powders falling off from its surface during process of moving, transportation and charging. Also, the air current of protective gas in a mono-crystal furnace or multi-crystal furnace has no negative influence on silicon brick with good compression resistance charged into a crucible. It is suitable to be the crucible recharging material in a mono-crystal furnace or multi-crystal furnace. Because the invention adopts the silicon powder produced by Siemens method, pyrolysis of silane, hydrogen reduction of $SiCl_4$ or other chemical vapor deposition methods as the raw material of the raw material silicon brick with good filling property, it increases the available raw material source of silicon solar cells and semiconductor chips. It turns silicon powder difficult to be utilized into an important raw material source for silicon solar cells and semiconductor chips. It is of great significance since silicon raw material is in short supply.

Even though the density of silicon brick produced by the dry pressing method of U.S. Pat. No. 7,175,685 is higher than loose silicon powder, its non-optimal compression resistance causes the problem of silicon dust flowing or the silicon brick being cracked during the process of discharging, transporting and charging into a mono-crystal furnace or multi-crystal furnace from the die.

DETAILED DESCRIPTION OF THE PREFERRED EMBODIMENTS

Example 1

An application method of silicon powder in a mono-crystal furnace or multi-crystal furnace comprising: pressing silicon powder having a particle size of 0.1 micrometer into silicon brick weighing 0.2 gram by cold isostatic pressing, then charging it into a furnace for silicon crystal growth.

Example 2

An application method of silicon powder in a mono-crystal furnace or multi-crystal furnace comprising: pressing silicon powder having a particle size of 0.5 micrometer into silicon brick weighing 1 gram by cold isostatic pressing, then charging it into a furnace for silicon crystal growth.

Example 3

An application method of silicon powder in a mono-crystal furnace or multi-crystal furnace comprising: pressing silicon powder having a particle size of 0.8 micrometer into silicon brick weighing 2 grams by cold isostatic pressing, then charging it into a furnace for silicon crystal growth.

Example 4

An application method of silicon powder in a mono-crystal furnace or multi-crystal furnace comprising: pressing silicon powder having a particle size of 1 micrometer into silicon brick weighing 5 grams by cold isostatic pressing, then charging it into a furnace for silicon crystal growth.

Example 5

An application method of silicon powder in a mono-crystal furnace or multi-crystal furnace comprising: pressing silicon powder having a particle size of 2 micrometers into silicon brick weighing 10 grams by cold isostatic pressing, then charging it into a furnace for silicon crystal growth.

Example 6

An application method of silicon powder in a mono-crystal furnace or multi-crystal furnace comprising: pressing silicon powder having a particle size of 5 micrometers into silicon brick weighing 50 grams by cold isostatic pressing, then charging it into a furnace for silicon crystal growth.

Example 7

An application method of silicon powder in a mono-crystal furnace or multi-crystal furnace comprising: pressing silicon powder having a particle size of 8 micrometers into silicon brick weighing 100 grams by cold isostatic pressing, then charging it into a furnace for silicon crystal growth.

Example 8

An application method of silicon powder in a mono-crystal furnace or multi-crystal furnace comprising: pressing silicon powder having a particle size of 10 micrometers into silicon brick weighing 200 grams by cold isostatic pressing, then charging it into a furnace for silicon crystal growth.

Example 9

An application method of silicon powder in a mono-crystal furnace or multi-crystal furnace comprising: pressing silicon powder having a particle size of 15 micrometers into silicon brick weighing 300 grams by cold isostatic pressing, then charging it into a furnace for silicon crystal growth.

Example 10

An application method of silicon powder in a mono-crystal furnace or multi-crystal furnace comprising: pressing silicon powder having a particle size of 20 micrometers into silicon brick weighing 500 grams by cold isostatic pressing, then charging it into a furnace for silicon crystal growth.

Example 11

An application method of silicon powder in a mono-crystal furnace or multi-crystal furnace comprising: pressing silicon powder having a particle size of 30 micrometers into silicon brick weighing 800 grams by cold isostatic pressing, then charging it into a furnace for silicon crystal growth.

Example 12

An application method of silicon powder in a mono-crystal furnace or multi-crystal furnace comprising: pressing silicon powder having a particle size of 50 micrometers into silicon brick weighing 1,000 grams by cold isostatic pressing, then charging it into a furnace for silicon crystal growth.

Example 13

An application method of silicon powder in a mono-crystal furnace or multi-crystal furnace comprising: pressing silicon powder having a particle size of 80 micrometers into silicon brick weighing 1,500 grams by cold isostatic pressing, then charging it into a furnace for silicon crystal growth.

Example 14

An application method of silicon powder in a mono-crystal furnace or multi-crystal furnace comprising: pressing silicon powder having a particle size of 100 micrometers into silicon brick weighing 2,000 grams by cold isostatic pressing, then charging it into a furnace for silicon crystal growth.

Example 15

An application method of silicon powder in a mono-crystal furnace or multi-crystal furnace comprising: pressing silicon powder having a particle size of 120 micrometers into silicon brick weighing 3,000 grams by cold isostatic pressing, then charging it into a furnace for silicon crystal growth.

Example 16

An application method of silicon powder in a mono-crystal furnace or multi-crystal furnace comprising: pressing silicon powder having a particle size of 150 micrometers into silicon brick weighing 5,000 grams by cold isostatic pressing, then charging it into a furnace for silicon crystal growth.

Example 17

An application method of silicon powder in a mono-crystal furnace or multi-crystal furnace comprising: pressing silicon powder having a particle size of 180 micrometers into silicon brick weighing 8,000 grams by cold isostatic pressing, then charging it into a furnace for silicon crystal growth.

Example 18

An application method of silicon powder in a mono-crystal furnace or multi-crystal furnace comprising: pressing silicon powder having a particle size of 200 micrometers into silicon brick weighing 10,000 grams by cold isostatic pressing, then charging it into a furnace for silicon crystal growth.

Example 19

An application method of silicon powder in a mono-crystal furnace or multi-crystal furnace comprising: pressing silicon powder having a particle size of 250 micrometers into silicon brick weighing 20,000 grams by cold isostatic pressing, then charging it into a furnace for silicon crystal growth.

Example 20

An application method of silicon powder in a mono-crystal furnace or multi-crystal furnace comprising: pressing silicon powder having a particle size of 280 micrometers into silicon brick weighing 50,000 grams by cold isostatic pressing, then charging it into a furnace for silicon crystal growth.

Example 21

An application method of silicon powder in a mono-crystal furnace or multi-crystal furnace comprising: pressing silicon powder having a particle size of 300 micrometers into silicon brick weighing 80,000 grams by cold isostatic pressing, then charging it into a furnace for silicon crystal growth.

Example 22

An application method of silicon powder in a mono-crystal furnace or multi-crystal furnace comprising: pressing silicon powder having a particle size of 400 micrometers into silicon brick weighing 100,000 grams by cold isostatic pressing, then charging it into a furnace for silicon crystal growth.

Example 23

An application method of silicon powder in a mono-crystal furnace or multi-crystal furnace comprising: pressing silicon powder having a particle size of 500 micrometers into silicon brick weighing 200,000 grams by cold isostatic pressing, then charging it into a furnace for silicon crystal growth.

Example 24

An application method of silicon powder in a mono-crystal furnace or multi-crystal furnace comprising: pressing silicon powder having a particle size of 600 micrometers into silicon brick weighing 500,000 grams by cold isostatic pressing, then charging it into a furnace for silicon crystal growth.

Example 25

An application method of silicon powder in a mono-crystal furnace or multi-crystal furnace comprising: pressing silicon powder having a particle size of 700 micrometers into silicon brick weighing 800,000 grams by cold isostatic pressing, then charging it into a furnace for silicon crystal growth.

Example 26

An application method of silicon powder in a mono-crystal furnace or multi-crystal furnace comprising: pressing silicon powder having a particle size of 800 micrometers into silicon brick weighing 1,000,000 grams by cold isostatic pressing, then charging it into a furnace for silicon crystal growth.

Example 27

An application method of silicon powder in a mono-crystal furnace or multi-crystal furnace comprising: pressing silicon powder having a particle size of 900 micrometers into silicon brick weighing 1,500,000 grams by cold isostatic pressing, then charging it into a furnace for silicon crystal growth.

Example 28

An application method of silicon powder in a mono-crystal furnace or multi-crystal furnace comprising: pressing silicon powder having a particle size of 1000 micrometers into silicon brick weighing 2,000,000 grams by cold isostatic pressing, then charging it into a furnace for silicon crystal growth.

Example 29

An application method of silicon powder in a mono-crystal furnace or multi-crystal furnace comprising: pressing silicon powder having a particle size of 0.1 to 1,000 micrometers into silicon brick by hot isostatic pressing, then charging it into a furnace for silicon crystal growth. The conditions above can be repeated with the specifications of examples 1 through 28.

Example 30

An application method of silicon powder in a mono-crystal furnace or multi-crystal furnace comprising: pressing silicon powder having a particle size of 0.1 to 1,000 micrometers into silicon brick by cold or hot isostatic pressing, then charging it into a furnace for silicon crystal growth to be used as the original raw material for silicon crystal growth. The conditions above can be repeated with the specifications of examples 1 through 29.

Example 31

An application method of silicon powder in a mono-crystal furnace or multi-crystal furnace, wherein the silicon crystal growth is used in the solar or semiconductor industry. The above condition also applies to example 30.

Example 32

An application method of silicon powder in a mono-crystal furnace or multi-crystal furnace, wherein a mono-crystal furnace is used for growing monocrystalline silicon. The conditions above can be repeated with the specifications of examples 1 through example 31.

Example 33

An application method of silicon powder in a mono-crystal furnace or multi-crystal furnace, wherein a multi-crystal furnace is used for growing polycrystalline silicon. The conditions above can be repeated with the specifications of examples 1 through 31.

Example 34

An application method of silicon powder in a mono-crystal furnace or multi-crystal furnace comprising: pressing silicon powder having a particle size of 0.1 to 1,000 micrometers into silicon brick by cold or hot isostatic pressing, then charging it into a mono-crystal furnace as the original raw material of silicon crystal growth. The conditions above can be repeated with the specifications of examples 1 through 29.

Example 35

An application method of silicon powder in a mono-crystal furnace or multi-crystal furnace comprising: pressing silicon powder having a particle size of 0.1 to 1,000 micrometers into silicon brick by cold or hot isostatic pressing, then charging it into a multi-crystal furnace as the original raw material of silicon crystal growth. The conditions above can be repeated with the specifications of examples 1 through 29.

Example 36

An application method of silicon powder in a mono-crystal furnace or multi-crystal furnace comprising: pressing silicon powder having a particle size of 0.1 to 1,000 micrometers into silicon brick by cold or hot isostatic pressing, then charging it into a mono-crystal furnace as the original raw material of silicon crystal growth in the solar or semiconductor field. The conditions above can be repeated with the specifications of examples 1 through 29.

Example 37

An application method of silicon powder in a mono-crystal furnace or multi-crystal furnace comprising: pressing silicon powder having a particle size of 0.1 to 1,000 micrometers into silicon brick by cold or hot isostatic pressing, then charging it into a multi-crystal furnace as the original raw material of silicon crystal growth in the solar or semiconductor field. The conditions above can be repeated with the specifications of example 1 through 29.

Example 38

An application method of silicon powder in a mono-crystal furnace or multi-crystal furnace, wherein the silicon powder has a purity of 99.9% to 99.9999999999%. The conditions above can be applied to examples 1 through 37.

Example 39

An application method of silicon powder in a mono-crystal furnace or multi-crystal furnace comprising: adding a binder to the silicon powder in a weight ratio of 0.1% to 10%, then pressing it into silicon brick by cold or hot isostatic pressing. The conditions above can be repeated with the specifications of examples 1 through 37.

Example 40

An application method of silicon powder in a mono-crystal furnace or multi-crystal furnace, wherein the pressure of cold isostatic pressing is 10 MPa to 800 MPa. The conditions above can be repeated with the specifications of examples 1 through 28 and examples 30 through 39.

Example 41

An application method of silicon powder in a mono-crystal furnace or multi-crystal furnace, wherein the pressure of hot isostatic pressing is 10 Mpa to 800 MPa, and the temperature is 30° C.-1,400° C. The conditions above can be repeated with the specifications of examples 29 through 39.

Example 42

An application method of silicon powder in a mono-crystal furnace or multi-crystal furnace, wherein silicon powder having a particle size of 0.1 to 1,000 micrometers is made by Siemens method or pyrolysis of silane or hydrogen reduction of $SiCl_4$. The conditions above can be repeated for the specifications of examples 1 through 39.

Example 43

An application method of silicon powder in a mono-crystal furnace or multi-crystal furnace, wherein the following isostatic pressing method is used:
(1) Making soft packaging materials into a container.
(2) Charging 20,000 grams of silicon powder having a particle size of 35 micrometers and a purity of 99.99999% which is produced by Siemens method, pyrolysis of silane, hydrogen reduction of $SiCl_4$ or other chemical vapor deposition methods into the container, and sealing the container.
(3) Then putting the container into a liquid medium.
(4) Pressurizing the liquid medium using a pressing machine with a pressure of 150 Mpa for 8 minutes at room temperature.
(5) Stopping the pressurizing and taking the product out from the container.

Taking a sample from the raw material silicon brick with good filling property. Its compression resistance is 3 Mpa. Taking seven samples from 20,000 grams raw material silicon brick to test their density. The range of their density is 1.79 to 1.81 g/cm$^3$, and the average density is 1.802 g/cm$^3$.

(6) Cutting the 20,000 grams raw material silicon brick into small silicon bricks, then charging the small silicon bricks into mono-crystal furnace or multi-crystal furnace.

Example 44

An application method of silicon powder in a mono-crystal furnace or multi-crystal furnace, wherein the following isostatic pressing method is used:
(1) Making soft packaging materials into a container.
(2) Charging 20,000 grams of silicon powder having a particle size of 20 micrometers and a purity of 99.99999% which is produced by Siemens method, pyrolysis of silane, hydrogen reduction of $SiCl_4$ or other chemical vapor deposition methods into the container, and sealing the container.
(3) Then putting the container made from soft packaging materials into a liquid medium.
(4) Pressurizing the liquid medium, using a pressing machine with a pressure of 130 Mpa for 8 minutes at room temperature.
(5) Stopping the pressurizing, and taking the product out from the container.
(6) Storing the product, raw material silicon brick with good filling property, in a sealed bag for use in the future.

(7) Opening the sealed bag and putting the raw material silicon brick with good filling property into a mono-crystal furnace or multi-crystal furnace for the production of silicon crystal.

Example 45

The use of a raw material silicon brick with good filling property in a mono-crystal furnace or multi-crystal furnace, wherein the raw material silicon brick has a purity of 99.99% to 99.9999999%, and its compression resistance is 0.1 Mpa to 50 Mpa. Then charging it into a mono-crystal furnace or multi-crystal furnace as the original raw material of silicon crystal growth.

Example 46

The use of a raw material silicon brick with good filling property in mono-crystal furnace or multi-crystal furnace, wherein the raw material silicon brick has a density of 0.8 $g/cm^3$ to 2.2 $g/cm^3$. The conditions above can be repeated for the specifications of example 45.

Example 47

The use of a raw material silicon brick with good filling property in a mono-crystal furnace or multi-crystal furnace, wherein the silicon powder used to produce the raw material silicon brick has a particle size of 0.1 to 1,000 micrometers. The conditions above can be repeated for the specifications of example 45.

Example 48

The use of a raw material silicon brick with good filling property in a mono-crystal furnace or multi-crystal furnace, wherein the density of the raw material silicon brick is uniform, and the density difference between any two points on any cross-section of the silicon brick ranges from 0-18%. The conditions above can be repeated for the specifications of example 45.

Example 49

The use of a raw material silicon brick with good filling property in a mono-crystal furnace or multi-crystal furnace, wherein the raw material silicon brick with good filling property is produced from silicon powder by isostatic pressing method. The silicon powder is produced by Siemens method or pyrolysis of silane or hydrogen reduction of $SiCl_4$ or chemical vapor deposition. The conditions above can be repeated for the specifications of examples 45 through 48.

Example 50

The use of a raw material silicon brick with good filling property in a mono-crystal furnace or multi-crystal furnace, wherein isostatic pressing has a pressure of 100 Mpa to 800 Mpa. The conditions above can be repeated for the specifications of example 49.

Example 51

The use of a raw material silicon brick with good filling property in a mono-crystal furnace or multi-crystal furnace, wherein the micro structure of the raw material silicon brick is different than that of silicon ingot after melting or the raw material silicon brick produced by traditional dry pressing method. The conditions above can be repeated for the specifications of examples 45 through 48.

Example 52

The use of a raw material silicon brick with good filling property in a mono-crystal furnace or multi-crystal furnace, wherein the raw material silicon brick with good filling property is produced by sintering forming method. First, silicon powder or small silicon chunks are mixed with a binder in a weight ratio of 100:0-2.1, and with grinding ball for 2 to 24 hours to make even, degassing under vacuum. Second, the mixture obtained from the above step is placed into a container. After pressurizing the mixture with a pressure of 100 Mpa to 300 Mpa while maintaining a temperature of 100° C. to 120° C., it is sintered for 2 to 4 hours at a temperature of 600° C. to 1400° C. to eliminate the binder under vacuum conditions or under protection of inert gas. The mixture is cooled down to room temperature to obtain the raw material silicon brick with good filling property. The raw material of the binder is polyvinyl alcohol or polyvinyl butyral or polyethylene glycol. Ethanol is added in a weight ratio of 5:1 to obtain the binder. The conditions above can be repeated for the specifications of examples 45 through 48.

Example 53

The use of a raw material silicon brick with good filling property in a mono-crystal furnace or multi-crystal furnace, wherein the raw material silicon brick with good filling property is produced by the following processes: charging silicon powder or small silicon chunks into a cylindrical die with die set, then covering a guide die; wherein a heating interlayer is arranged outside the peripheral of the cylindrical die, and the heating interlayer is charged with heat conducting oil, a punch is corresponding to the guide die; pressurizing the silicon powder or small silicon chunk with a pressure of 10 Mpa to 800 Mpa for 0.1 to 1 hour while maintaining a temperature of 400° C. to 1,400° C., then cooling down to room temperature, and taking out the bulk product, raw material silicon brick with good filling property. The conditions above can be repeated for the specifications of examples 45 through 48.

Example 54

The use of a raw material silicon brick with good filling property in a mono-crystal furnace or multi-crystal furnace, wherein the raw material silicon brick with good filling property is produced by the following method:

(1) Mixing silicon powder or small silicon chunks with a binder in a weight ratio of 100:0.5, and with grinding ball for 2 to 24 hours to make even, degassing under vacuum. The raw material of the binder is polyvinyl alcohol or polyvinyl butyral or polyethylene glycol. Ethanol is added in a weight ratio of 5:1 to obtain the binder.

(2) Putting the mixture obtained from the first step into a cylindrical die with a die set, then covering the guide die, wherein a heating interlayer is arranged outside the peripheral of the cylindrical die, and the heating interlayer is charged with heat conducting oil. There is a punch corresponding to the guide die. Pressurizing the mixture with a pressure of 30 Mpa to 50 Mpa for 0.1 to 0.5 hour while maintaining a temperature of 500° C. to 800° C., then cooling it down to room temperature, and taking out the bulk product. Eliminating the binder under a vacuum or under protection of argon gas at a temperature of 600° C. to 1,400° C. until the weight ratio of the residual binder is 0-0.0001% based on the bulk product; cooling it down to room temperature to obtain the raw material silicon brick with good filling property. The conditions above can be repeated for the specifications of examples 45 through 48.

Example 55

The use of a raw material silicon brick with good filling property in a mono-crystal furnace or multi-crystal furnace, wherein the raw material silicon brick with good filling property is produced by the following method: mixing silicon powder or small silicon chunks with a binder in a weight ratio of 100:0-10.0, and putting the mixture into a container made from soft packaging materials after mixing evenly. The raw material of binder is polyvinyl alcohol or polyvinyl butyral or polyethylene glycol. Ethanol is added in a weight ratio of 5:1 to obtain the binder. The conditions above can be repeated for the specifications of examples 45 through 48.

Example 56

The use of a raw material silicon brick with good filling property in a mono-crystal furnace or multi-crystal furnace, wherein the raw material silicon brick with good filling property is produced by the following isostatic pressing method:
(1) Making soft packaging materials into a container.
(2) Putting silicon powder or small silicon chunks into the container, and sealing the container.
(3) Then putting the container into a liquid medium.
(4) Pressurizing the liquid medium, in which the container is placed, by a pressing machine.
(5) Stopping the pressurizing and taking the product out from the container. The conditions above can be repeated for the specifications of examples 45 through 48.

Example 57

The use of a raw material silicon brick with good filling property in a mono-crystal furnace or multi-crystal furnace, wherein the raw material silicon brick with good filling property is produced by the following isostatic pressing method:
(1) Making soft packaging materials into a container.
(2) Putting silicon powder or small silicon chunks into the container, and sealing the container.
(3) Then putting the container into a liquid medium.
(4) Pressurizing the liquid medium using a pressing machine with a pressure of 10 Mpa to 800 Mpa for 5 to 60 minutes while maintaining a temperature at 25° C. to 1,400° C.
(5) Stopping the pressurizing and taking the product out from the container. The conditions above can be repeated for the specifications of examples 45 through 48.

Example 58

The use of a raw material silicon brick with good filling property in a mono-crystal furnace or multi-crystal furnace, wherein the raw material silicon brick with good filling property is produced by the following isostatic pressing method:
(1) Making soft packaging materials into a container.
(2) Putting silicon powder or small silicon chunks into the container, and sealing the container.
(3) Then putting the container into a liquid medium.
(4) Pressurizing the liquid medium using a pressing machine with a pressure of 10 Mpa to 500 Mpa for 5 to 60 minutes while maintaining a temperature at 0° C. to 500° C.
(5) Stopping the pressurizing and taking the product out from the container.
(6) Storing the product, the raw material silicon brick with good filling property, in a sealed bag for future use.
(7) Opening the sealed bag, putting the raw material silicon brick with good filling property into the mono-crystal furnace or the multi-crystal furnace for the production of silicon crystal. The conditions above can be repeated for the specifications of examples 45 through 48.

Example 59

The use of a raw material silicon brick with good filling property in a mono-crystal furnace or multi-crystal furnace comprising: putting fresh silicon powder produced by Siemens method, pyrolysis of silane, or hydrogen reduction of $SiCl_4$ into an isostatic pressing machine within 144 hours to complete the isostatic pressing. The conditions above can be repeated for the specifications of examples 56 through 58.

Example 60

The use of a raw material silicon brick with good filling property in a mono-crystal furnace or multi-crystal furnace comprising:
(1) Making soft packaging materials into a container.
(2). Putting fresh silicon powder or small silicon chunks produced by Siemens method, pyrolysis of silane, or hydrogen reduction of $SiCl_4$ into the container within 2 hours, and sealing the container.
(3) Then putting the container into a liquid medium.
(4) Pressurizing the liquid medium, using a pressing machine with a pressure of 150 Mpa for 20 minutes at room temperature.
(5) Stopping the pressurizing and taking the product out from the container.
(6) Storing the product, the raw material silicon brick with good filling property, in a sealed bag for future use.
(7) Opening the sealed bag, putting the raw material silicon brick with good filling property into the mono-crystal furnace or the multi-crystal furnace for the production of silicon crystal. The conditions above can be repeated for the specifications of examples 56 through 58.
After measuring, the compression resistance of the raw material silicon brick is 3 Mpa. Its loose density is 1.83 g/cm$^3$. Because the pressure for pressurizing is 150 Mpa, and the pressurizing time is 20 minutes, the requirements for the machine are moderate. This example is the optimal embodiment of the invention.

Example 61

The use of a raw material silicon brick with good filling property in a mono-crystal furnace or multi-crystal furnace, wherein the raw material silicon brick with good filling property is produced by the following isostatic pressing method:
(1) Making soft packaging materials into a container.
(2) Putting silicon powder or small silicon chunks into the container and sealing the container.
(3) Then putting the container into a liquid medium.
(4) Pressurizing the liquid medium, using a pressing machine with a pressure of 300 Mpa for 30 minutes at 30° C.
(5) Stopping the pressurizing and taking the product out from the container.

(6) Storing the product, the raw material silicon brick with good filling property in a sealed bag for future use.

(7) Opening the sealed bag, put the raw material silicon brick with good filling property into the mono-crystal furnace or the multi-crystal furnace for the production of silicon crystal. The conditions above can be repeated for the specifications of examples 45 through 48.

Example 62

The use of a raw material silicon brick with good filling property in a mono-crystal furnace or multi-crystal furnace, wherein the raw material silicon brick with good filling property is produced by the following processes: putting silicon powder or small silicon chunks into a cylindrical die with a die set, then covering it with a guide die; wherein a heating interlayer is arranged outside the peripheral of the cylindrical die, and the heating interlayer is charged with heat conducting oil; a punch is corresponding to the guide die; pressurizing the silicon powder or small silicon chunks with a pressure of 500 Mpa for 0.7 hour at 800° C., then cooling down to room temperature, and taking out the bulk product. The conditions above can be repeated for the specifications of examples 45 through 48.

Example 63

The use of a raw material silicon brick with good filling property in mono-crystal furnace or multi-crystal furnace, wherein the raw material silicon brick with good filling property is produced by the following method:

(1) Mixing silicon powder or small silicon chunks with a binder in a weight ratio of 100:0.5, and with a grinding ball for 5 hours to make even, degassing under vacuum. The raw material of the binder is polyvinyl alcohol or polyvinyl butyral or polyethylene glycol. Ethanol is added in a weight ratio of 5:1 to obtain the binder.

(2) Putting the mixture obtained from the first step into a cylindrical die with a die set, then covering it with a guide die, wherein a heating interlayer arranged outside the peripheral of the cylindrical die, and the heating interlayer is charged with heat conducting oil. There is a punch corresponding to the guide die. Pressurizing the mixture with a pressure of 50 Mpa for 0.3 hour at 600° C., then cooling down to room temperature, and taking out the bulk product. Eliminating the binder at 900° C. under a vacuum or under protection of argon gas until the weight ratio of the residual binder is 0.0001% based on the bulk product; cooling down to room temperature. The conditions above can be repeated for the specifications of examples 45 through 48.

Example 64

Method of making raw material silicon brick with good filling property, wherein the raw material silicon brick with good filling property is produced by the following isostatic pressing method:

(1) Making soft packaging materials into a container.

(2) Putting 20,000 grams of silicon powder having a particle size of 35 micrometers and a purity of 99.99999%, which is produced by Siemens method, pyrolysis of silane, hydrogen reduction of $SiCl_4$ or other chemical vapor deposition methods, into the container and sealing the container.

(3) Then putting the container into a liquid medium.

(4) Pressurizing the liquid medium, using a pressing machine with a pressure of 150 Mpa for 8 minutes at room temperature.

(5) Stopping the pressurizing and taking the product out from the container.

A sample from the raw material silicon brick with good filling property is taken for measurement. Its compression resistance is 3 Mpa. Seven samples are taken from 20,000 grams of the raw material silicon brick to test their density. The distribution range of their density is within 1.79 g/cm$^3$ to 1.81 g/cm$^3$, and the average density is 1.802 g/cm$^3$.

Example 65

The use of the raw material silicon brick with good filling property in a mono-crystal furnace or multi-crystal furnace wherein the raw material silicon brick with good filling property in example 64 is stored in a sealed bag for future use Then the sealed bag is opened, and the raw material silicon brick is placed in a mono-crystal furnace or multi-crystal furnace for the production of silicon crystal.

Other Series of Examples

The invention can also use the process parameters in any one examples 1 through 41 instead of the process parameters of example 44 to make various combinations.

The invention can also use the process parameters in any one examples of 45 through 50 instead of the process parameters of example 64 to make various combinations.

INDUSTRIAL APPLICATION

The present invention involves producing a raw material silicon brick from silicon powder by cold isostatic pressing or hot isostatic pressing. The raw material silicon brick has good anti-oxidation and compression resistance properties. The silicon brick is not easily cracked and silicon powders do not easily fall off the surface. It has good filling property when charged into a mono-crystal furnace or a multi-crystal furnace. It is suitable to be used in the silicon production in solar cell or semiconductor field, and there is notable improvement over the industry standard.

What is claimed is:

1. An isostatic pressing method for applying silicon powder as an original raw material for silicon crystal growth, comprising:
pressing silicon powder having a particle size of 0.1 to 1,000 micrometers into a silicon brick employing cold or hot isostatic pressing to provide a pressed silicon brick; and
charging the pressed silicon brick into a furnace for silicon crystal growth.

2. The isostatic pressing method according to claim 1, wherein the furnace for silicon crystal growth is a mono-crystal furnace for growing monocrystalline silicon or a multi-crystal furnace for growing polycrystalline silicon.

3. An isostatic pressing method for applying silicon powder as an original raw material for silicon crystal growth in a mono-crystal furnace or a multi-crystal furnace, comprising:
pressing silicon powder having a particle size of 0.1 to 1,000 micrometers into a silicon brick employing cold or hot isostatic pressing to provide a pressed silicon brick; and
charging the pressed silicon brick into the mono-crystal furnace or the multi-crystal furnace for silicon crystal growth for use in the solar cell or semiconductor industry.

4. The isostatic pressing method according to claim 3, wherein the silicon powder has a purity within a range of 99.99% to 99.9999999% of silicon.

5. The isostatic pressing method according to claim 3, wherein cold isostatic pressing is performed in a pressure range of 10 MPa to 800 MPa.

6. The isostatic pressing method according to claim 3, wherein hot isostatic pressing is performed in a pressure range of 10 Mpa to 800 Mpa and at a temperature range of 30° C. to 1,400° C.

7. The isostatic pressing method according to claim 3, further comprising providing the silicon powder by one of a Siemens method, pyrolysis of silane, or hydrogen reduction of $SiCl_4$.

8. The isostatic pressing method according to claim 1, wherein the silicon powder has a purity within a range of 99.99% to 99.9999999% silicon.

* * * * *